United States Patent [19]

Schröder

[11] 4,318,009

[45] Mar. 2, 1982

[54] CIRCUIT SYSTEM FOR THE GENERATION OF A DIRECT CONTROL VOLTAGE DEPENDING UPON AN ALTERNATING VOLTAGE

[75] Inventor: Ernst Schröder, Hanover, Fed. Rep. of Germany

[73] Assignee: Licentia Patent-Verwaltungs-G.m.b.H., Frankfurt am Main, Fed. Rep. of Germany

[21] Appl. No.: 89,895

[22] Filed: Oct. 31, 1979

[30] Foreign Application Priority Data

Nov. 23, 1978 [DE] Fed. Rep. of Germany ....... 2850736

[51] Int. Cl.³ ........................................... H03K 17/56
[52] U.S. Cl. .................................. 307/246; 307/261; 307/597; 330/281
[58] Field of Search ................. 330/141, 281; 455/244; 307/246, 261, 294

[56] References Cited

U.S. PATENT DOCUMENTS 3,154,740 10/1964 Eness ................................... 455/244

*Primary Examiner*—James B. Mullins
*Attorney, Agent, or Firm*—Spencer & Kaye

[57] ABSTRACT

In a circuit for the generation of a direct control voltage dependent upon an alternating voltage the changing of the control voltage is delayed after a rapid decrease in the alternating voltage amplitude. This delay time is controllable in dependence upon the time difference between an increase and a rapid decrease of the alternating voltage amplitude.

7 Claims, 3 Drawing Figures

CIRCUIT SYSTEM FOR THE GENERATION OF A DIRECT CONTROL VOLTAGE DEPENDING UPON AN ALTERNATING VOLTAGE

BACKGROUND OF THE INVENTION

The invention relates to a circuit system for the generation of a control voltage dependent upon an alternating voltage.

This kind of circuit system has been described in the applicant's own patent applications Nos. P 28 30 784.8 and P 28 30 786.0 which have not been published at an earlier date. It is possible to employ these circuit systems as control voltage generators in a compander system of the kind as has for example been described in the US. Pat. No. 3,969,680. In the case of this compander circuit the input of the control voltage generator is supplied through another electronically controllable amplifier on compression with the alternating voltage output signal and on expansion with the alternating voltage input signal from an electronically controllable amplifier located in the useful signal path. The direct voltage output signal of the control voltage generator is fed both into the control input of the amplifier located in the useful signal path and also into the control input of the further amplifier. The control voltage generator acts in this context so that on exceeding of a threshold value by the alternating voltage fed into the input of the control voltage generator it generates a swiftly rising direct voltage which varies the amplification of the amplifier located in the useful signal path until the alternating voltage at the input of the control voltage generator has dropped back below the said threshold value.

A swift variation of the transfer constant of the amplifier located in the useful signal path is especially important when the level of the useful signal varies in jumps over extensive ranges. A jump in level from a small to a large value would otherwise give rise to a risk of the compressor output signal overshooting thereby producing saturation of the transmission channel. A jump in level in the reverse direction would result in the generation of audible noise signals at the output of the expander during the transition time following readjustment. For the achievement of a complementary behaviour of compressor and expander allowance should expendiently be made in the same manner both in respect of compressor and expander for the characteristics specific for the modes of operation of the expander and compressor.

The control voltage generator for controlling the transfer constant of the amplifiers located in the useful signal path must therefore furnish a direct control voltage which is swiftly adapted to the momentary level of the useful signal. Prerequisite for this is a short charge change time constant effective at large level jumps on the charging capacitor belonging to the control voltage generator. In the stationary state or in the case of slow variations in level the charge change time constant should however be large to make sure that the direct control voltage does not vary in rhythm with the useful signal frequency. Such behaviour would give rise to a large non-linear distortion factor.

The general term charge change is employed in this context because the above considerations have validity both for circuits in which the charging capacitor is charged with increasing alternating voltage amplitude and for circuits in which the charging capacitor is discharged. It follows that it is necessary to meet several contradictory requirements when fixing the charge change time constants of charging capacitors.

In the case of a slow reduction in the alternating voltage amplitude the charge of the charging capacitor will be changed slowly. This changing of the charge begins at the instant at which the momentary value of the alternating voltage amplitude falls below a given threshold value. The time constant of this slow change in charge is fixed so that the maximum permissible non-linear distortion factor is just reached at the lowest signal frequency.

The large charge change time constant interferes when the alternating voltage drops quickly, because e.g. in the case of the expander, the transfer constant is not reduced at a quick enough rate so that interference noises in the transmission channel which had been previously swamped or masked by powerful useful signals are now becoming audible. A short charge change time and thereby a small charge change time constant for the control voltage generator are required in case of a rapid reduction in the alternating voltage amplitude. So as to ensure undistorted reproduction of the last oscillation sequence of the powerful useful signal the changeover to a smaller time constant may however occur only after completion of the last oscillation sequence. In view of the fact that the longest period of oscillation occurs at the lowest signal frequency it is necessary to fix the time lag for the changeover from a large to a small time constant in accordance as a function of the lowest signal frequency. Whilst some non-swamped noise can be detected at the output from the expander when the useful signal amplitude is reduced to a smaller value prior to the lapsing of this time lag, it has to be borne in mind that the human ear takes a certain length of time to adapt itself from a loud to a low level noise impression. The non-masked noise will therefore not be noticed when the time lag for the changeover of the time constant is picked shorter than the physiological time span of adaptation of human hearing.

The statements made so far were concerned with operational cases in which a useful signal had been available for an extended period of time prior to the decrease in amplitude. There exist however also sound situations (lit:events) in the case of which the amplitude rises briefly and falls back immediately afterwards (e.g. sharp reports or bangs, striking of piano chords). The time taken by human hearing for a change from low level to loud sound plays a role in this case. The auditory sensitivity for low level sound is not removed by a very brief loud sound impression. This may lead to a situation in which interference noises become audible at the output from an expander controlled by way of large transfer constant within the above discussed time lag after the termination of the brief useful signal. According to the invention the time lag based on the lowest signal frequency is therefore cut down or controlled to be zero in the case of very brief useful signals. This cutting down of the time lag is permissible with regard to the maximum non-linear distortion factor, because very brief useful signals cannot possess any low frequency spectrum fractions (portions), which would have to be allowed for in fixing (rating) the time lag.

SUMMARY OF THE INVENTION

The object of the invention is therefore the provision of a circuit system which controls the charge change time constants with a view of preventing overshooting with a degree of considerable reliability, ensuring a small non-linear distortion factor and producing the physiological swamping of noise signals by powerful useful signals. This object is solved for the case of a circuit system for the generation of a direct control voltage wherein in the event of increase of the alternating voltage amplitude the susceptance of a first circuit is increased and in the event of a rapid decrease in the alternating voltage amplitude the susceptance of a second circuit is increased whereby a time-lag element is arranged in the control path for the second control circuit, by the susceptance of the second circuit being controllable in dependence upon the time difference between an increase and a rapid decrease of the alternating voltage amplitude.

The advantage of the invention is therein that the time lag of the time-lag element can be controlled with a view of achieving a brief period of non-swamped noise whilst adhering to the permissible non-linear distortion factor.

The circuit system in accordance with the invention is instrumental in improving the behaviour of the control voltage generator during a diminuation in the alternating voltage amplitude.

DESCRIPTION OF THE PREFERRED EMBODIMENT

The invention will now be explained with the aid of several examples of embodiments which are shown in the attached drawings.

All these circuit systems are suitable for control voltage generators for compander systems which feed an alternating voltage signal with constant dynamics to the control voltage generator in the stationary state and which only in the event of input side amplitude jumps produce amplitude variations of short duration which are however then restored to the stationary value by the control circuit. The shown circuits may by way of example be employed as control voltage generators for the function blocks designated with 5 in FIGS. 1 and 2 of the U.S. Pat. No. 3,969,680 cited at the beginning.

Figure 1:
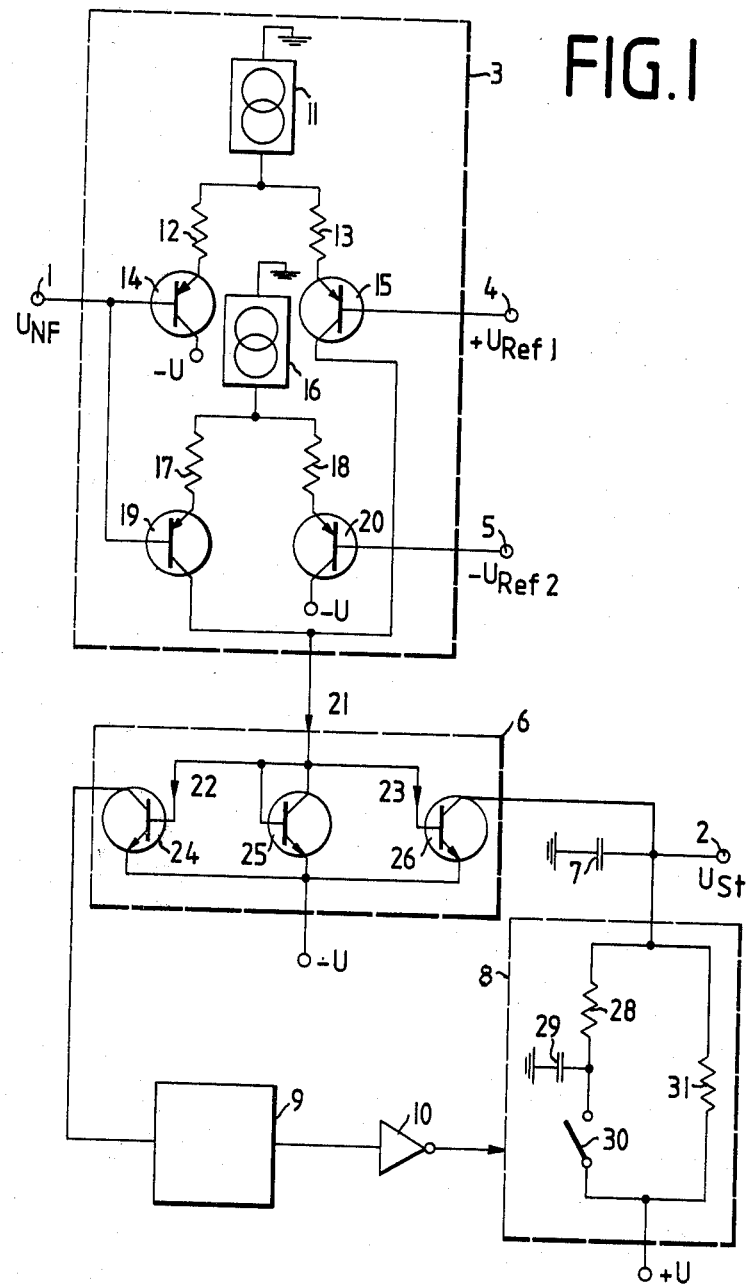
FIG. 1 a simple form of embodiment of the circuit in accordance with the invention, FIG. 2 a block circuit diagram of a second form of embodiment, FIG. 3 a block circuit diagram of a third form of embodiment.

In the case of the circuit in accordance with the invention shown in FIG. 1 the alternating voltage is fed through an input terminal 1 into a comparator circuit 3. The comparator circuit 3 is connected on the output side with a current level circuit 6 which is employed on one hand for changing the charge of the charging capacitor 7 and thereby is a first circuit and which is employed on the other hand for the triggering of a time-lag element 9. The time-lag element 9 controls through an inverter 10 a second circuit 8, the susceptance of which is variable. The voltage existing at the charging capacitor 7 may be tapped as control voltage from an output terminal 2.

The comparator circuit 3 comprises comparators for the comparison of the positive and negative half waves of the alternating input voltage with reference voltages. The comparators for the positive and negative half waves consist of like design differential amplifiers which each cooperate with one current source. The comparator for the positive half wave comprises two transistors 15 and 14, two emitter resistances 12 and 13 co-operating with a current source 11. The comparator for the negative half wave comprises two transistors 19 and 20, two emitter resistances 17 and 18 in cooperation with a current source 16. The emitters of the transistors of each of these comparators are connected through the emitter resistances 12, 13 and 17, 18 respectively to a junction with the relevant current source 11 or 16 respectively. The alternating voltage signals are fed through the input terminal 1 to the bases of the first transistors 14 or 19 respectively. The base of the second transistor 15 of the comparator for the positive half wave is connected through an input terminal 4 with a positive reference voltage source whilst the base of the second transistor of the comparator for the negative half wave is connected to an input terminal 5 for the negative reference voltage. In the case of the comparator for the positive half wave the collector of the first transistor 14, and in the case of the comparators for the negative half wave the collector of the second transistor 20 is connected to a reference voltage ($-U$). The collectors of the other two transistors 15, 19 are connected with one another and with an input 21 of the current level circuit 6 made up of transistors 24, 25, 26. The bases of the transistors 24 and 26 are designated as control inputs 23 and 22. The bases of the transistors 24, 25, 26 and the collector of the transistor 25 are connected to the control input 21 of the current level circuit 6. The emitters of the transistors 24, 25 and 26 are connected with one another and are connected to a reference voltage ($-U$). The collector of the transistor 26 is wired to the charging capacitor 7. The transistor 26 is employed to act as electronically controllable first circuit for this charging capacitor. The other terminal of the charging capacitor 7 is wired to a reference voltage (earth). For changing the charge of the charging capacitor in opposite direction, there is employed a second electronically controllable circuit 8 which is connected with one terminal to the common junction of the charge capacitor 7, the collector of transistor 26 and the output terminal 2, and is connected with the other terminal to a reference voltage ($+U$). The electronically controllable second circuit 8 is made up of two separate parallel wired current paths with a resistance 31 and the cascade connection comprising a resistance 28 and a switch 30. The terminal of the resistance 28 away from the charging capacitor 7 is wired to another capacitor 29, the other terminal of which is connected to earth. Resistance 28 and capacitor 29 constitute a buffer circuit.

A control module comprising transistor 24, the time-lag circuit 9 and the inverter 10 is employed for controlling the electronically controllable second circuit 8. In this the collector of the transistor 24 is wired to the control input of the time-lag circuit 9. The output from the time-lag circuit 9 is wired through the inverter 10 to the control input of the electronically controllable second circuit 8. The time-lag circuit 9 is beneficially designed in the form of a current controllable post-triggerable monostable flip-flop unit (trigger stage).

The comparators of the circuit 3 operate in the manner, that the transistors 15 or 19 respectively furnish a current directly the instantaneous value of the alternating input voltage $U_{NF}$ exceeds the value of the positive reference voltage minus the maximum voltage drop at the emitter resistance 12 ($U_{Ref1} - I_{11} \cdot R_{12}$) or when the instantaneous value falls below the negative reference voltage plus the maximum voltage drop at the emitter resistance 18 ($-U_{Ref2}+I_{16}\cdot R_{34}$). The current furnished by the transistors 15 or 19 respectively is fed into the input 21 of the current level circuit 6. Such a standard circuit employed in IC-engineering is employed for controlling one or several further currents in the ratio of 1:1 by means of a single control current. The magnitude of the controlled currents are a precise reproduction of the control current. In the present case the same current will flow into the relevant collectors of the transistors 24 and 26 as is fed into the control input of the current level circuit 6. By reason of this it is possible to employ the control voltage from the collectors of the transistors 15 and 19 both for controlling the charging current for the charging capacitor 7 through the transistor 26 and for triggering the time-lag circuit 9 through the transistor 24.

The above stated information for the instantaneous value of the alternating input voltage are the threshold values at which the first circuit becomes conducting. These threshold values will in the stationary state be just exceeded by the peaks of the instantaneous values of the alternating input voltage. The current flowing periodically in the first circuit compensates then just the current in the second circuit adjusted to lowest conductivity, so that a constant control voltage $U_{St}$ may be tapped at the charging capacitor 7.

The threshold values preset by the reference voltages will be greatly exceeded in the event of a sudden increase in level. An increased control voltage arrives as consequential result at the control input 21 whereupon the charging current path with the transistor 26 furnishes an increased charging current. The circuit is preferably rated so that the charging current which flows is proportional to the ratio of the instantaneous value of the alternating input voltage and the above given threshold values.

The charging voltage at the charging capacitor 7 which voltage governs the transfer constant of the controllable amplifier, is adapted in the described manner to the increased alternating current level through variation of the charging time constant. This results in the avoidance of any severe overshooting which may cause overmodulation of the transmission channel the extent of dynamics of which is limited.

Since the amplitude jumps of the alternating voltage serve amongst other features as control parameters it is possible to achieve a quick coordination between the transfer constant of the amplifiers and the useful signal level with good accuracy.

Signals fed to the control input 21 also serve, by means of the transistor 24, to trigger the time-lag circuit 9 which is beneficially constructed in the form of a current controlled post-triggerable monostable flip-flop stage. The time-lag circuit 9 trips (flips) into an instable state when the control voltage passing into the input of the time-lag circuit 9 exceeds a given threshold. The output signal from the time-lag circuit 9 inverted by the inverter 10 effects opening of the switch 30 and thereby the parallel branch of the second circuit makes no contribution towards conductivity.

For the case that the instantaneous values of the alternating input voltage $U_{NF}$ no longer attain the above stated threshold values the time-lag circuit 9 still retains its instable state for a preset delay time. After lapsing of this delay time the switch 30 is closed and the conductance of the second circuit 8 is increased by the switching on of the parallel branch. In the case of the shown form of embodiment the circuit 8 is advantageously changed over between two conductances. This circuit realises two charge change time constants for the charging capacitor 7. It is also conceivable to replace the circuit 8 by circuit with transistors which are triggered differently. Through the behaviour of the time-lag circuit arranged in the control branch of the second control circuit is achieved that after a rapid falling off of the alternating input voltage the dying out of the useful signal cannot be falsified by a just rapid variation of the transfer constant. After lapsing of the time-lag the transfer constant of the controllable amplifiers is on the other hand varied in time so that no interfering noise can be noticed.

The circuit exhibits a different behaviour pattern when after a decreasing useful signal or after the operational case without triggering the alternating voltage amplitude increases suddenly and decreases immediately afterwards. Prior to the occurrance of this signal event the circuit 8 is controlled into maximum conductivity through closure of the switch 30. As the one terminal of the circuit 8 is connected with the voltage $+U$ it follows that the capacitor 29 between the resistance 28 and earth will also have a charge $+U$. Any sudden increase in the alternating voltage signal has the consequence that the time-lag element flips into the instable state and causes opening of the switch 30 by the output signal through the inverter 10. When shortly afterwards the alternating voltage level drops back again below the threshold values preset by the reference voltage, the control input of the time-lag circuit 9 receives, it is true, no further trigger pulses, but the switch 30 remains open for the delay time of the time-lag element. The charge stored by the capacitor 29 contributes in this case towards an increase of the susceptance of the second circuit 8 and thereby bridges the delay time of the time-lag element 9. The charge of the capacitor 29 is discharged through the resistance 28 after opening of the switch 30. The effect of the capacitor 29 decreases with increasing difference between the point in time of increase and the point in time of decrease of the alternating voltage amplitude. With increasing time difference between increase and decrease of the alternating voltage amplitude there thus occurs an increase in the effective time for the changeover of the control voltage generator from the large to the small time constant until the maximum value in the magnitude of the delay time of the time-lag element 9 is reached. It is because of the above-described bridging effect that elements 28 and 29 are viewed as a buffer circuit.

Figure 2:
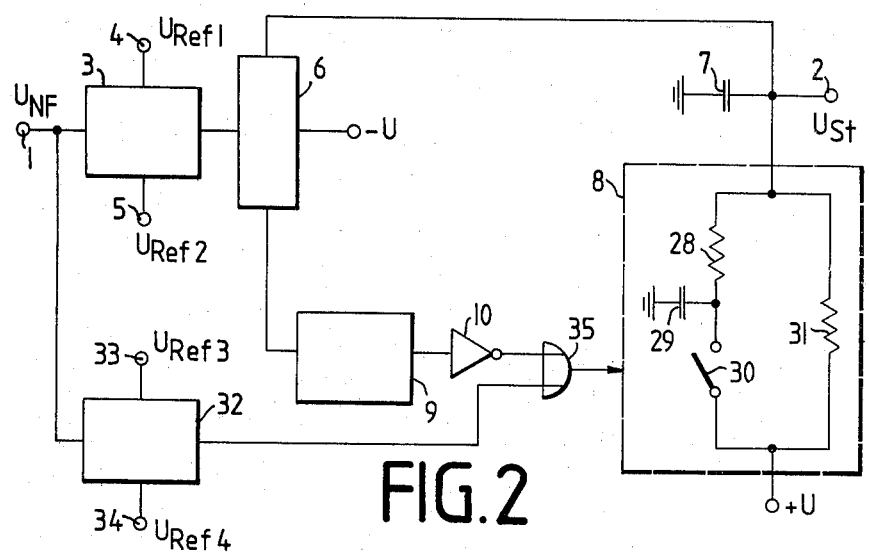

Another example of embodiment is shown in FIG. 2. Equivalent modules bear the same references as have been used in FIG. 1. The comparator 3 and the current level circuit 6 are only shown as blocks. The circuit in accordance with FIG. 2 comprises on top of the circuit per FIG. 1 another comparator 32, which may typically be of the same design as the comparator 3. The difference from comparators 3 is solely that input terminals 33 and 34 are subject to reference voltages $U_{Ref3}$ and $-U_{Ref4}$, which are larger than the corresponding reference voltages $U_{Ref1}$ and $-U_{Ref2}$. The output of the comparator 32 is capable of controlling the switch 30 whereby it is connected with the other control branch from the current level circuit 6, the time-lag circuit 9 and the inverter 10 through an OR-logic element 35 with the control input of the switch 30. When the comparator 32 is of the same design as the comparator 3 its output value is a current. It is then necessary either for the second input of the OR-logic element 35 to be current sensitive or for a current-voltage converter to be inserted.

The above described additional circuit 32, 35 is employed for controlling the effective delay time for switching over from the long to the short time constant after a short useful signal. The first half wave will produce overshooting when a useful signal increases suddenly. Overshooting is fundamentally unavoidable because the control voltage generator needs a certain control deviation to be able to react. This peak value of the alternating input voltage causes the comparator 32 to vary its output state on exceeding of the reference voltages $U_{Ref3}$ or $-U_{Ref4}$ and to briefly close the switch 30 through the OR-logic element 35. This causes charging of the capacitor 29 to the voltage $+U$ through the closed switch 30. Due to the small transient time through change of the charge of the charging capacitor 7 via the current level circuit 6 there occurs an immediate fall of the voltage on the comparator 32 below the said reference voltages and the switch 30 opens because it is not yet controlled to its "closed" setting due to the holding time of the time-lag element 9. The capacitor 29 is however now charged and acts as described above; i.e. the circuit 8 furnishes for a short period a larger current. When shortly afterwards the alternating current amplitude falls back again severely the charge discharged by the capacitor 29 bridges the time-lag of the time-lag element 9. In this case too the effective delay time is prolonges as a function of the duration of the useful signal. The circuit per FIG. 2 has the advantage that it reacts to every sudden rise in the alternating voltage amplitude and that the circuit thereby becomes independent from the state of the control voltage generator prior to the occurrance of the signal event; this applies even when prior to the event the switch 30 had already been opened by the signals of the time-lag element 9 and the inverter 10. The reference voltages $U_{Ref3}$ and $-U_{Ref4}$ are preferably rated so that the charging of the capacitor 29 takes only place in the event of upwards level jumps of more than abt. 10 dB at the terminal 1. This criterion for the selection of the small charge time constant after a sudden falling off of the useful signal is by virtue of this to a large extent matched with the physiological adaptation time of human hearing from low level to loud noise events.

Figure 3:
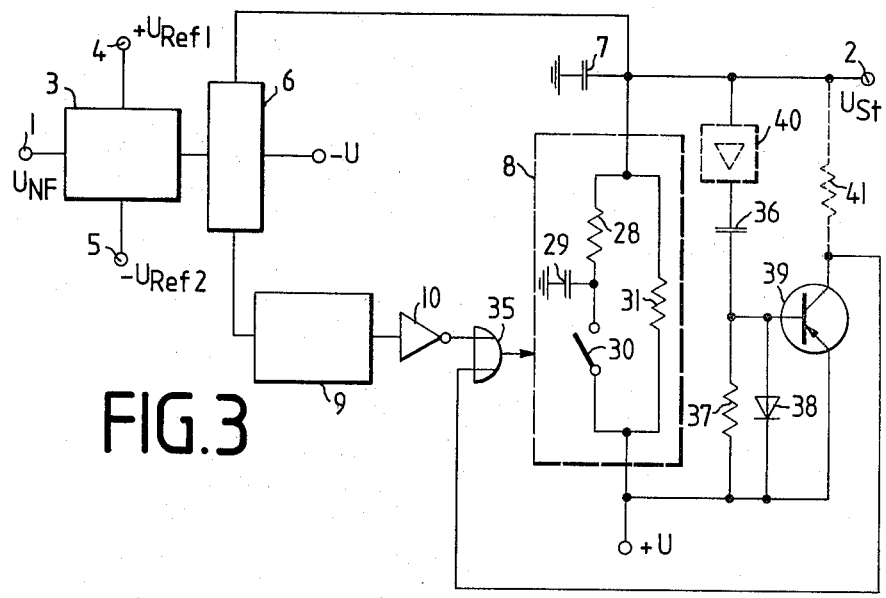

FIG. 3 shows yet another form of embodiment of the invention. In this case too any modules which correspond to the ones shown in FIGS. 1 and 2 bear the same reference symbols. The comparator 32 for assessing the alternating input voltage is in the circuit per FIG. 3 replaced by a differentiating element with a capacitor 36 and a resistance 37, which assesses any variations in the charging state of the charging capacitor. Parallel to the resistance is wired a diode 38 for the shortcircuiting of voltages derived from a change in state of the charging capacitor 7 in direction towards a drop in the alternating voltage at the terminal 1. The common junction of the capacitor 36, the resistance 37 and the diode 38 is connected with the base of a transistor 39. This transistor controls through the OR-logic element 35 the switch 30. In the event of a variation in the charge of the charging capacitor 7 caused by an increase in the alternating voltage there takes place through the capacitor 36 an equally large variation of the voltage at the resistance 37. This voltage controls the transistor 39 to be conducting so that the switch 30 is closed through the OR-logic element 35, and the capacitor 29 is charged. As a function of the time constant of the differentiating element 36, 37 there takes place a fall in the voltage at the resistance 37, so that after a certain time the transistor 39 is blocked. The switch 30 opens after this. In the event of a sudden increase in the alternating voltage and a shortly afterwards occurring decrease the circuit works in the same manner as has been described in connection with FIG. 2.

As has been indicated in FIG. 3 with a broken line it is also possible to connect the collector of the transistor 39 through a resistance 41 with the charging capacitor 7. The OR-logic element 35 and the capacitor 29 could be dispensed with in this case. The emitter-collector section of the transistor 39 and the resistance 41 are then connected in parallel to the circuit 8. Shortly after variation of the charge capacitor 7—caused by a rise in the alternating voltage—the conductivity of the transistor 39 is controlled to take on a maximum value. The conductivity falls back as a function of the time constant of the differentiating element with the capacitor 36 and the resistance 37. The effect upon the charge change time constant of the charging capacitor 7 is by virtue of this the same as explained in conjunction with the capacitor 29 and the resistance 23. It is also possible to provide a buffer amplifier 40 between the capacitor 36 and the charging capacitor 7. The object of this is to ensure that the differentiating element 36, 37 does not influence the value of the time constant from the current level circuit 6, the charging capacitor 7, the resistance 28 and the capacitor 29.

What is claimed is:

1. A circuit system for generating a direct control voltage dependent upon an alternating voltage, comprising: a charging capacitor across which the direct control voltage appears; a first circuit connected for subjecting said capacitor to a charge change in a first direction at a rate which is a function of the amplitude of the alternating voltage; a second circuit connected for subjecting said capacitor to a charge change in a second direction opposite to the first direction and having a variable conductance which determines the rate at which it effects such charge change, and control means including a time-lag element connected to said second circuit and responsive to a sudden increase in the alternating voltage for reducing the conductance of said second circuit and to a decrease in the alternating voltage below a selected threshold value for increasing the conductance of said second circuit; wherein said second circuit includes means defining a buffer circuit operative for causing the rate of charge change effected by said second circuit after such sudden alternating voltage increase to vary as a function of the duration of the time interval between such sudden increase and a succeeding decrease in the alternating voltage below the selected threshold.

2. Circuit system in accordance with claim 1, wherein said buffer circuit is connected both with said charging capacitor and with a voltage source, and said buffer circuit has a time dependent susceptance.

3. Circuit system in accordance with claim 2, wherein said buffer circuit comprises a second capacitor and a resistance and is connected through an electronically operable switch to the voltage source.

4. Circuit system in accordance with claim 3, wherein the switch is connected to a comparator for the alternating voltage.

5. Circuit system in accordance with claim 3, wherein the switch is connected to a differentiating element which is arranged between said charging capacitor and a reference voltage.

6. Circuit system in accordance with claim 5, wherein one resistance of the differentiating element is bridged with a rectifier.

7. Circuit system in accordance with claim 5, wherein the differentiating element is connected through a buffer amplifier with said charging capacitor.

* * * * *